(12) United States Patent
Dunn et al.

(10) Patent No.: US 11,597,339 B2
(45) Date of Patent: Mar. 7, 2023

(54) SOLAR POWERED VEHICLE MOUNTED DISPLAY

(71) Applicant: Manufacturing Resources International, Inc., Alpharetta, GA (US)

(72) Inventors: William Dunn, Alpharetta, GA (US); Jack Bartholmae, Duluth, GA (US); Douglas Bennett, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 17/584,007

(22) Filed: Jan. 25, 2022

(65) Prior Publication Data

US 2022/0148467 A1 May 12, 2022

Related U.S. Application Data

(63) Continuation of application No. 16/915,774, filed on Jun. 29, 2020, now Pat. No. 11,285,895.
(Continued)

(51) Int. Cl.
*B60R 16/033* (2006.01)
*H05K 5/00* (2006.01)
(Continued)

(52) U.S. Cl.
CPC ............. *B60R 16/033* (2013.01); *B60K 6/24* (2013.01); *B60K 6/26* (2013.01); *B60K 6/28* (2013.01);
(Continued)

(58) Field of Classification Search
CPC ..... B60R 16/033; B60R 9/04; B60R 11/0229; B60R 11/0235; B60R 16/03; B60R 2011/004; H02J 7/0068; H02J 7/35; H02J 3/381; H02J 2300/24; E04H 1/1211; H05K 5/0017; H05K 7/20972; H05K 7/20172; H05K 7/202; H05K 7/20954; H02S 10/40; H02S 30/10; H02S 40/38; H02S 20/10; H02S 40/425; B60Y 2300/91;
(Continued)

(56) References Cited

U.S. PATENT DOCUMENTS 3,141,588 A 7/1964 McMiller
3,525,461 A 8/1970 Bronson
(Continued)

FOREIGN PATENT DOCUMENTS

AU 201815719 10/2018
AU 201815720 10/2018
(Continued)

OTHER PUBLICATIONS

Adnation, Miller photos, May 9, 2017, 28 pages.
(Continued)

*Primary Examiner* — Robert L Deberadinis
(74) *Attorney, Agent, or Firm* — Standley Law Group LLP; Jeffrey S. Standley; Adam J. Smith

(57) ABSTRACT

Systems and methods for providing solar-generated power to a display unit mounted to a vehicle are provided. One or more mounting supports connect a housing for an electronic display to the vehicle. A solar energy harvesting device is secured to an upper portion of the vehicle and is electrically connected to the electronic display.

20 Claims, 10 Drawing Sheets

Related U.S. Application Data

(60) Provisional application No. 62/911,806, filed on Oct. 7, 2019, provisional application No. 62/892,104, filed on Aug. 27, 2019.

(51) Int. Cl.

| | | |
|---|---|---|
| *H05K 7/20* | (2006.01) | |
| *B60R 13/00* | (2006.01) | |
| *H02J 7/00* | (2006.01) | |
| *H02S 10/40* | (2014.01) | |
| *H02S 30/10* | (2014.01) | |
| *H02S 40/38* | (2014.01) | |
| *H02J 7/35* | (2006.01) | |
| *B60L 58/10* | (2019.01) | |
| *B60K 6/24* | (2007.10) | |
| *B60K 6/26* | (2007.10) | |
| *B60K 6/28* | (2007.10) | |
| *B60R 9/04* | (2006.01) | |
| *B60R 11/02* | (2006.01) | |
| *G09F 21/04* | (2006.01) | |
| *H02S 20/10* | (2014.01) | |
| *E04H 1/12* | (2006.01) | |
| *G09F 19/22* | (2006.01) | |
| *H02J 3/38* | (2006.01) | |
| *H02S 40/42* | (2014.01) | |
| *B60R 16/03* | (2006.01) | |
| *G09F 9/33* | (2006.01) | |
| *G09F 9/35* | (2006.01) | |
| *B60R 11/00* | (2006.01) | |

(52) U.S. Cl.
CPC .............. *B60L 58/10* (2019.02); *B60R 9/04* (2013.01); *B60R 11/0229* (2013.01); *B60R 11/0235* (2013.01); *B60R 13/00* (2013.01); *B60R 16/03* (2013.01); *E04H 1/1211* (2013.01); *G09F 19/22* (2013.01); *G09F 21/04* (2013.01); *G09F 21/042* (2020.05); *H02J 3/381* (2013.01); *H02J 7/0068* (2013.01); *H02J 7/35* (2013.01); *H02S 10/40* (2014.12); *H02S 20/10* (2014.12); *H02S 30/10* (2014.12); *H02S 40/38* (2014.12); *H02S 40/425* (2014.12); *H05K 5/0017* (2013.01); *H05K 7/202* (2013.01); *H05K 7/20172* (2013.01); *H05K 7/20954* (2013.01); *H05K 7/20972* (2013.01); *B60R 2011/004* (2013.01); *B60Y 2300/91* (2013.01); *B60Y 2400/112* (2013.01); *B60Y 2400/43* (2013.01); *B60Y 2400/60* (2013.01); *G09F 9/33* (2013.01); *G09F 9/35* (2013.01); *H02J 2300/24* (2020.01)

(58) Field of Classification Search
CPC .......... B60Y 2400/112; B60Y 2400/43; B60Y 2400/60; G09F 21/04; G09F 19/22; G09F 21/042; G09F 9/33; G09F 9/35; B60L 58/10; B60K 6/24; B60K 6/28; B60K 6/26

See application file for complete search history.

(56) References Cited

U.S. PATENT DOCUMENTS

| | | |
|---|---|---|
| 3,978,599 A | 9/1976 | Berger |
| 4,052,806 A | 10/1977 | George |
| 4,114,789 A | 9/1978 | Blaylock et al. |
| 4,261,496 A | 4/1981 | Mareydt et al. |
| 4,449,656 A | 5/1984 | Wouden |
| 4,500,020 A | 2/1985 | Rasor |
| 4,534,496 A | 8/1985 | Bott |
| 4,640,450 A | 2/1987 | Gallion et al. |
| 4,671,004 A | 6/1987 | Berg |
| D294,137 S | 2/1988 | Robson |
| D296,087 S | 6/1988 | Luck |
| 4,768,691 A | 9/1988 | Stapleton |
| 4,778,092 A | 10/1988 | Grace |
| D306,990 S | 4/1990 | Bott |
| 4,972,983 A | 11/1990 | Bott |
| 4,982,886 A | 1/1991 | Cucheran |
| D314,983 S | 2/1991 | Cangianni et al. |
| 4,993,615 A | 2/1991 | Arvidsson |
| 5,016,798 A | 5/1991 | Stapleton et al. |
| 5,038,988 A | 8/1991 | Thulin |
| D320,971 S | 10/1991 | Sparham et al. |
| 5,104,020 A | 4/1992 | Arvidsson et al. |
| D326,282 S | 5/1992 | Spoljaric |
| 5,132,666 A | 7/1992 | Fahs |
| 5,170,920 A | 12/1992 | Corrente et al. |
| 5,171,083 A | 12/1992 | Rich |
| 5,207,365 A | 5/1993 | Bott |
| 5,257,710 A | 11/1993 | Cropley |
| 5,306,156 A | 4/1994 | Gibbs et al. |
| 5,347,736 A | 9/1994 | Kanigan |
| 5,385,285 A | 1/1995 | Cucheran et al. |
| 5,474,218 A | 12/1995 | Arsenault, Jr. et al. |
| 5,560,525 A | 10/1996 | Grohmann et al. |
| D398,409 S | 9/1998 | Jessa |
| 5,826,766 A | 10/1998 | Aftanas |
| 5,845,828 A | 12/1998 | Settelmayer |
| 5,871,190 A | 2/1999 | Henriksson |
| 5,979,723 A | 11/1999 | Tress et al. |
| 6,050,467 A | 4/2000 | Drouillard et al. |
| D430,901 S | 9/2000 | Palmer |
| 6,114,954 A | 9/2000 | Palett et al. |
| 6,116,486 A | 9/2000 | Lindell |
| D453,194 S | 1/2002 | Gentelia et al. |
| 6,378,747 B1 | 4/2002 | Fisch et al. |
| 6,415,970 B1 | 7/2002 | Kmita et al. |
| D486,188 S | 2/2004 | Norcross et al. |
| 6,701,143 B1 | 3/2004 | Dukach et al. |
| 6,812,851 B1 | 11/2004 | Dukach et al. |
| 6,850,209 B2 | 2/2005 | Mankins et al. |
| 7,134,764 B1 | 11/2006 | Bieberdorf |
| 7,434,713 B2 | 10/2008 | Linden |
| D634,722 S | 3/2011 | Kim et al. |
| D635,614 S | 4/2011 | Yan |
| D639,340 S | 6/2011 | Martin |
| D647,970 S | 11/2011 | Strempack |
| D654,116 S | 2/2012 | McDougall et al. |
| 8,122,628 B2 | 2/2012 | Johnson, Jr. |
| D657,421 S | 4/2012 | Yan |
| D657,422 S | 4/2012 | Yan |
| D669,938 S | 10/2012 | Lard et al. |
| 8,534,516 B1 | 9/2013 | Vo |
| D694,170 S | 11/2013 | Eriksson |
| D704,265 S | 5/2014 | Yan |
| 8,895,836 B2 | 11/2014 | Amin et al. |
| 9,121,391 B1 | 9/2015 | Koehler, III |
| 9,135,839 B2 | 9/2015 | Remenda |
| D740,472 S | 10/2015 | Linton et al. |
| D763,357 S | 8/2016 | Tsuru et al. |
| D765,660 S | 9/2016 | Kim et al. |
| 9,451,060 B1 | 9/2016 | Bowers et al. |
| 9,516,485 B1 | 12/2016 | Bowers et al. |
| D775,989 S | 1/2017 | Kalanick et al. |
| D777,258 S | 1/2017 | Strempack et al. |
| 9,622,392 B1 | 4/2017 | Bowers et al. |
| D792,833 S | 7/2017 | Chan |
| D793,890 S | 8/2017 | Hong |
| D815,690 S | 4/2018 | Squillante |
| 9,994,160 B2 | 6/2018 | Kim et al. |
| D839,352 S | 1/2019 | Lim et al. |
| D848,528 S | 5/2019 | Lee et al. |
| D848,529 S | 5/2019 | Lee et al. |
| 10,290,243 B2 | 5/2019 | Lanham |
| 10,326,962 B2 | 6/2019 | Hamilton |
| 10,486,618 B2 | 11/2019 | Hornsby et al. |
| D869,378 S | 12/2019 | Hornsby et al. |

(56) References Cited

U.S. PATENT DOCUMENTS

| | | |
|---|---|---|
| D878,467 S | 3/2020 | Hornsby et al. |
| D879,202 S | 3/2020 | Hornsby et al. |
| D902,836 S | 11/2020 | Hornsby et al. |
| 10,827,657 B2 | 11/2020 | Lee |
| 10,994,669 B2 | 5/2021 | Hornsby et al. |
| 11,100,822 B2 | 8/2021 | Hornsby et al. |
| 11,148,621 B2 | 10/2021 | Dunn et al. |
| 11,164,491 B2 | 11/2021 | Hornsby et al. |
| 11,203,312 B2 | 12/2021 | Dunn et al. |
| 2002/0009978 A1 | 1/2002 | Dukach et al. |
| 2002/0065046 A1 | 5/2002 | Mankins et al. |
| 2002/0084891 A1 | 7/2002 | Mankins et al. |
| 2002/0112026 A1 | 8/2002 | Fridman et al. |
| 2002/0159270 A1 | 10/2002 | Lynam et al. |
| 2002/0164962 A1 | 11/2002 | Mankins et al. |
| 2003/0119448 A1 | 6/2003 | Arntz |
| 2004/0004827 A1 | 1/2004 | Guest |
| 2004/0036622 A1 | 2/2004 | Dukach et al. |
| 2004/0170013 A1 | 9/2004 | Smythe |
| 2004/0182898 A1 | 9/2004 | Harris |
| 2005/0051684 A1 | 3/2005 | Linden |
| 2005/0116511 A1 | 6/2005 | Leroy et al. |
| 2006/0091170 A1 | 5/2006 | Almhil |
| 2007/0108243 A1 | 5/2007 | Bingham |
| 2007/0158965 A1 | 7/2007 | Van Smirren |
| 2007/0252409 A1 | 11/2007 | Clinton et al. |
| 2008/0083800 A1 | 4/2008 | Mathew |
| 2008/0236007 A1 | 10/2008 | Au et al. |
| 2010/0079979 A1 | 4/2010 | Nakamichi et al. |
| 2010/0282799 A1 | 11/2010 | Hubbard |
| 2011/0072697 A1 | 3/2011 | Miller |
| 2011/0132946 A1 | 6/2011 | Sautter et al. |
| 2011/0298841 A1 | 12/2011 | Fujimori |
| 2011/0315726 A1 | 12/2011 | Huhn et al. |
| 2012/0002357 A1 | 1/2012 | Auld et al. |
| 2012/0061198 A1 | 3/2012 | Asatsuke et al. |
| 2012/0131936 A1 | 5/2012 | Yoshida et al. |
| 2012/0224116 A1 | 9/2012 | Barnes |
| 2012/0312848 A1 | 12/2012 | Delusky et al. |
| 2013/0098425 A1 | 4/2013 | Amin et al. |
| 2013/0173358 A1 | 7/2013 | Pinkus |
| 2014/0293605 A1 | 10/2014 | Chemel et al. |
| 2015/0122857 A1 | 5/2015 | Ferman et al. |
| 2015/0129625 A1 | 5/2015 | Gorey et al. |
| 2015/0175082 A1 | 6/2015 | Aftanas et al. |
| 2015/0232038 A1 | 8/2015 | Robertson |
| 2015/0274084 A1 | 10/2015 | Sarges et al. |
| 2015/0369274 A1 | 12/2015 | Stojkovic et al. |
| 2015/0381922 A1 | 12/2015 | Hamilton |
| 2016/0041423 A1 | 2/2016 | Dunn |
| 2017/0029043 A1 | 2/2017 | Clark et al. |
| 2017/0050576 A1 | 2/2017 | Ferman |
| 2017/0111486 A1 | 4/2017 | Bowers et al. |
| 2017/0111520 A1 | 4/2017 | Bowers et al. |
| 2017/0132960 A1 | 5/2017 | Kis-Benedek Pinero et al. |
| 2017/0257978 A1 | 9/2017 | Diaz |
| 2018/0170270 A1 | 6/2018 | Bergman |
| 2018/0172239 A1 | 6/2018 | Wacker et al. |
| 2018/0272959 A1 | 9/2018 | Hornsby et al. |
| 2018/0293921 A1 | 10/2018 | Margrill |
| 2019/0295386 A1 | 9/2019 | Roberts |
| 2020/0010025 A1 | 1/2020 | Hornsby et al. |
| 2020/0039450 A1 | 2/2020 | Hornsby et al. |
| 2020/0148126 A1 | 5/2020 | Griffith et al. |
| 2020/0207284 A1 | 7/2020 | Hornsby et al. |
| 2021/0061183 A1 | 3/2021 | Dunn et al. |
| 2021/0061197 A1 | 3/2021 | Dunn et al. |
| 2021/0061198 A1 | 3/2021 | Dunn et al. |
| 2021/0066923 A1 | 3/2021 | Dunn et al. |
| 2021/0221304 A1 | 7/2021 | Hornsby et al. |
| 2021/0313927 A1 | 10/2021 | Dunn et al. |
| 2021/0358350 A1 | 11/2021 | Hornsby et al. |

FOREIGN PATENT DOCUMENTS

| | | |
|---|---|---|
| AU | 201815721 | 10/2018 |
| AU | 2018237580 B2 | 1/2021 |
| CA | 183485 | 12/2019 |
| CA | 183486 | 12/2019 |
| CA | 183487 | 12/2019 |
| CN | 201228893 Y | 4/2009 |
| CN | 106782121 A | 5/2017 |
| CN | 109961695 A | 7/2019 |
| DE | 202007017477 U1 | 6/2008 |
| EM | 005638509-0001 | 9/2018 |
| EM | 005638541-0001 | 9/2018 |
| EM | 005638558-0001 | 9/2018 |
| EP | 0476288 A1 | 3/1992 |
| EP | 1065747 B1 | 3/2005 |
| EP | 3040766 A1 | 7/2016 |
| EP | 3602534 A1 | 2/2020 |
| EP | 3910617 A1 | 11/2021 |
| JP | 8-216779 A | 8/1996 |
| JP | H10-309995 A | 11/1998 |
| JP | 2001-151027 A | 6/2001 |
| JP | 3094183 U | 3/2003 |
| JP | 2006-53187 A | 2/2006 |
| JP | 2012-16086 A | 1/2012 |
| JP | 2012-255847 A | 12/2012 |
| JP | 1634158 S | 5/2019 |
| JP | 1634159 S | 5/2019 |
| JP | 1660382 S | 5/2020 |
| JP | 6855593 B2 | 3/2021 |
| KR | 10-2004-0039823 A | 5/2004 |
| KR | 10-0917344 B1 | 9/2009 |
| KR | 10-1444022 B1 | 10/2014 |
| KR | 30-1045258 | 2/2020 |
| KR | 30-1045259 | 2/2020 |
| KR | 30-1045260 | 2/2020 |
| WO | 2016/102980 A1 | 6/2016 |
| WO | 2018/175888 A1 | 9/2018 |
| WO | 2021/041381 A1 | 3/2021 |

OTHER PUBLICATIONS

LG-MRI, BoldVu Vehicle Top Displays, via Internet Archive Wayback Machine at URL: https://web.archive.org/web/20190327001140/https://lg-mri.com/digital-taxi-top-display/, Mar. 27, 2019, 8 pages.

McGarrybowen, Inside the Campaign: United Airlines "Real Time Taxi", https://www.aaaa.org/inside-campaign-united-airlines-real-time-taxi-mcgarrybowen-media-partners-kinetic-mec-verifone/, Jul. 7, 2017, 6 pages, American Association of Advertising Agencies.

Rave, DSE 2017: LG-MRI Presents TaxiVu, a Digital LCD Display for Mobile Advertising, video at https://www.youtube.com/watch?v=CmNw40BT6ZE, Mar. 30, 2017, 1 page.

Rave, DSE 2018: LG-MRI Highlights BoldVu Vehicle Top Display, VT1145LD, for DOOH Advertising, video at https://www.youtube.com/watch?v=IYSMhCnMyhg, Apr. 1, 2018, 1 page.

Adnation, Turn Key Solutions, May 23, 2017, 4 pages.

Gizmodo, Uber Will Puts Ads on Top of Vehicles Just Like Old-School Taxis, Feb. 24, 2020, 4 pages.

The Street, Lyft Acquires Halo Cars, a Startup That Places Ads on Vehicles, Feb. 21, 2020, 2 pages.

Marketingdive, Puma brings targeted hologram ads to car roofs for NBA All-Star game, Feb. 20, 2020, 3 pages.

Deploy Solution, Melford Technologies homepage, Mar. 3, 2020, 4 pages.

Commercial Integrator, WaiveCar Brings Car Sharing and Digital Signage Together with Help from BrightSign, Jul. 6, 2018, 9 pages.

Alie Express, P5 LED taxi top led display, wireless P5 car roof advertising led sign 960mm x 320mm two sides, webpage, accessed Apr. 8, 2021, 13 pages.

YouTube, Road Runner Media, Digital Break Light Video, screen shot of video portion, Jun. 1, 2020, 1 page.

YouTube, Road Runner Media, Roadrunner Media for McDonalds video, screen shot of video portion, Jun. 4, 2020, 1 page.

Vertigo Digital Displays, Innovation on Display FlexVu Totem Brochure, 2014, 6 pages.

(56) References Cited

OTHER PUBLICATIONS

Vertigo Digital Displays, FlexVu Totem Shelter, 2017, 2 pages.
Vertigo Digital Displays, All Products Catalogue, 2017, 14 pages.
Civiq Smartscapes, FlexVue Ferro 55P/55L, Mar. 16, 2017, 4 pages.
Gable, Blog Post: The Anatomy of an Interactive Kiosk, Aug. 15, 2018, 4 pages.
Civiq Smartscapes, There are companies that make kiosks. And then there's CIVIQ.—Advanced Smart City Platform, webpage, Jan. 30, 2019, 10 pages.
Civiq Smartscapes, Connecting people, places & experiences, webpage, Jan. 30, 2019, 5 pages.
Civiq Smartscapes, Connecting people, places & experiences, screen shot of devices webpage, Jan. 30, 2019, 1 page.
Melford Technologies, Part 1, video online at https://m.youtube.com/watch?v=OAV7zzVrHtE&feature=youtu.be, Oct. 21, 2019, 1 page.
Manufacturing Resources International, Manufacturing Resources International home webpage, Nov. 4, 2019, 2 pages.
Manufacturing Resources International, LCD Display Deployments webpage, Nov. 4, 2019, 3 pages.
Manufacturing Resources International, BoldVu Outdoor LCD Display webpage, Nov. 4, 2019, 2 pages.
Manufacturing Resources International, BoldVu Semi Outdoor LCD Display webpage, Nov. 8, 2019, 2 pages.
Manufacturing Resources International, BoldVu Vehicle Top LCD Display webpage, Nov. 8, 2019, 2 pages.
Manufacturing Resources International, Drivethru Menu Boards Webpage, Nov. 8, 2019, 2 pages.
Manufacturing Resources International, Storefront Digital Signage webpage, Nov. 8, 2019, 2 pages.

SOLAR POWERED VEHICLE MOUNTED DISPLAY

CROSS-REFERENCE TO RELATED APPLICATIONS

This application is a continuation of U.S. application Ser. No. 16/915,774 filed Jun. 29, 2020, which claims the benefit of US Provisional Application No. 62/892,104 filed on Aug. 27, 2019 and US Provisional Application No. 62/911,806 filed Oct. 7, 2019, the disclosures of each of which are hereby incorporated by reference as if fully restated herein.

TECHNICAL FIELD

Exemplary embodiments relate generally to vehicle mounted displays powered by solar panels.

BACKGROUND AND SUMMARY OF THE INVENTION

Electronic displays are increasingly replacing physical billboards, bulletins, posters, flyers, banners, and other physical signage for public announcements, advertising, and the like. It is known to provide such physical signage along sidewalks, along roadsides, at bus shelters, on poles, at drive throughs, on VTUs, and the like. Ruggedized display units have also commonly been provided for indoor, outdoor, and semi-outdoor use. Such electronic display assemblies may protect the electronic displays and related components from the elements. Exemplary examples of such electronic display assemblies may include those available from Manufacturing Resources International, Inc. of Alpharetta, Ga. (https://mri-inc.net/). These electronic display assemblies may be provided on sidewalks, on the ground, in windows, at bus shelters, at drive throughs, on the tops of vehicles, and the like to replace physical signage.

Advancements in solar energy are making solar panels more compact and efficient. Electronic display assemblies require power for operation. For example, such electronic display assemblies utilize lights, electronic displays, fans and other cooling equipment, electrical circuitry, and other electrically powered equipment which requires electrical power for operation. For ground mounted units, such power is generally provided by the electrical grid. In the case of VTUs, however, such power is generally provided by the vehicle. While VTUs may provide an extra source of revenue for vehicle drivers or companies, generally by displaying advertising for others, the extra weight of a VTU may reduce fuel efficiency, which negate some or all of the extra revenue. What is needed is a solar powered, vehicle mounted electronic display.

Systems and methods for solar powered, vehicle mounted electronic displays are disclosed herein. The vehicle mounted display units ("VMDU") may be configured for outdoor use. The VMDU may comprise one or more electronic displays within a housing. The VMDU may be mounted to a vehicle such as, but not limited to, a taxi cab, a personal vehicle, a commercial vehicle, a limousine, a town car, a bus, an SUV, a rideshare vehicle, a delivery vehicle, or the like. One or more supports may extend from or within the housing to a portion of the vehicle. For example, the VMDU may be mounted to a rear portion, side portion, front portion, roof, some combination thereof, or the like, of the vehicle. Placement of the VMDU on the rear, sides, or other locations of the vehicle may improve visibility and/or aerodynamics. One or more supports may extend between the housing and the vehicle.

One or more solar energy harvesting devices may be mounted to the vehicle. In exemplary embodiments, such solar energy harvesting devices are mounted to a roof portion of the vehicle, such as, but not limited to, the roof rack. An electronic connection, such as by way of wiring, may be provided between the solar energy harvesting devices and one or more components of the VMDU, such as, but not limited to, the electronic displays. Such connections may extend partially or completely within the supports for the solar energy harvesting devices and/or the electronic displays.

Power generated by the solar energy harvesting devices may be used to power the VMDU, or select components thereof such as, but not limited to, the electronic displays, when conditions are sufficiently sunny. Excess energy may be stored at one or more energy storage devices. In exemplary embodiments, the energy storage devices may be batteries within the housing or the vehicle. When the power generated by the one or more solar energy harvesting devices is insufficient to power the VMDU, or select components thereof, energy may be drawn from the one or more energy storage devices.

For example, without limitation, when a gasoline or other like powered vehicle is idle, the engine is often shut off. This results in shutting down the alternator and powering any electrical equipment, such as the electronic display, by draining power from the vehicle battery. Of course, with electrically powered vehicles, as another example without limitation, powering any electrical device requiring draining charge from the batteries. With the present invention, the electronic display could be partially or wholly powered by the solar energy harvesting devices. Excess energy may be used to charge the vehicle battery.

Often times, vehicle drivers are required to return their vehicle with a full amount of fuel (such as, but not limited to, a full tank of gas, a full battery charge, some combination thereof, or the like). The power supplied by the solar energy harvesting devices may be sufficient to negate some or all of the fuel efficiencies losses experienced from addition of the VMDU, and/or exceed the fuel efficiencies losses such that fuel efficiency is improved. Thus, the use of such solar energy harvesting devices may reduce the environmental impact of such electronic display assemblies.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Figure 1:
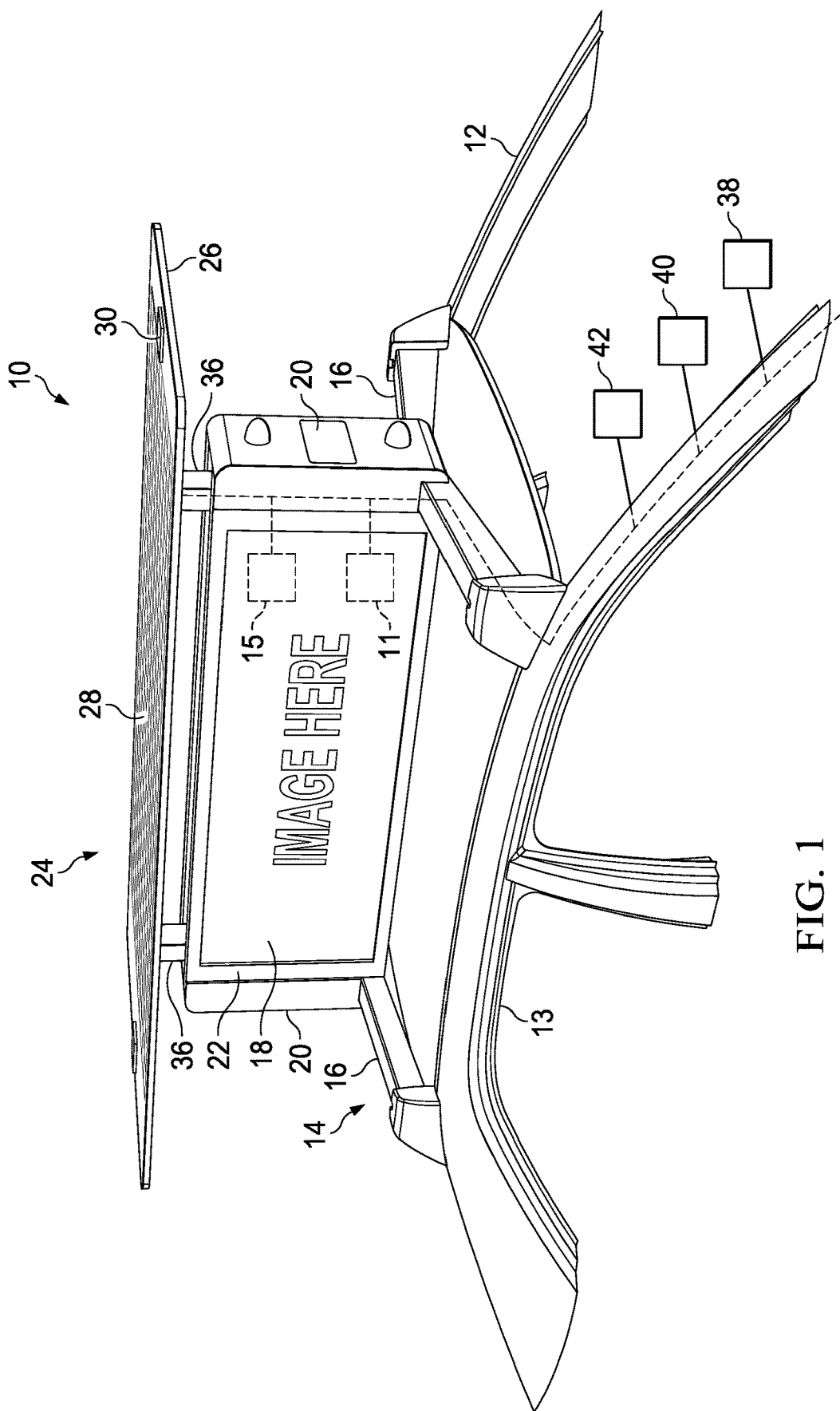
FIG. 1 is a front perspective view of an exemplary vehicle mounted display unit ("VMDU") with an exemplary solar energy harvesting device with certain internal components revealed and illustrated in simplified form.
Figure 2:
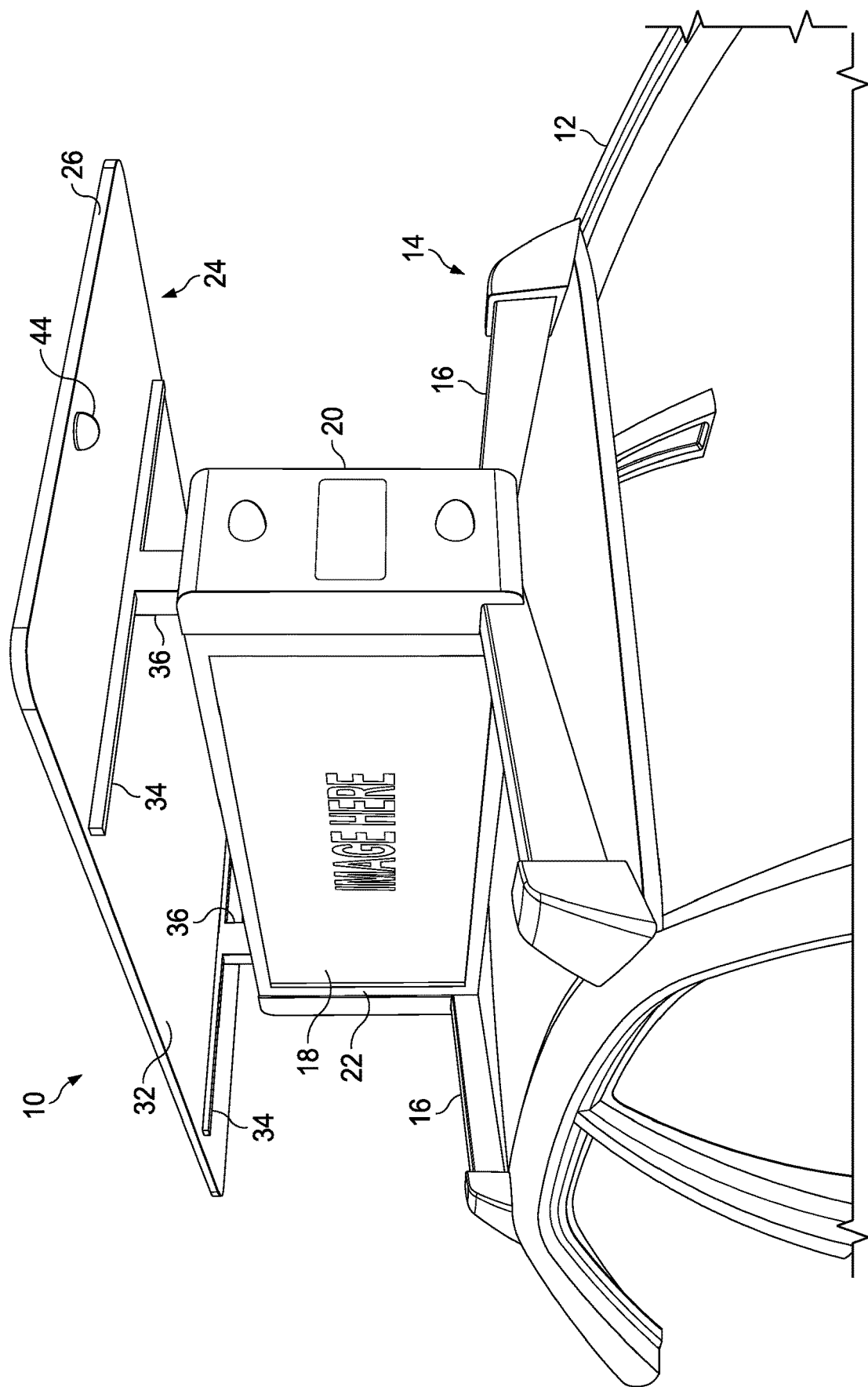
FIG. 2 is a left side perspective view of the VMDU of FIG. 1.
Figure 3:
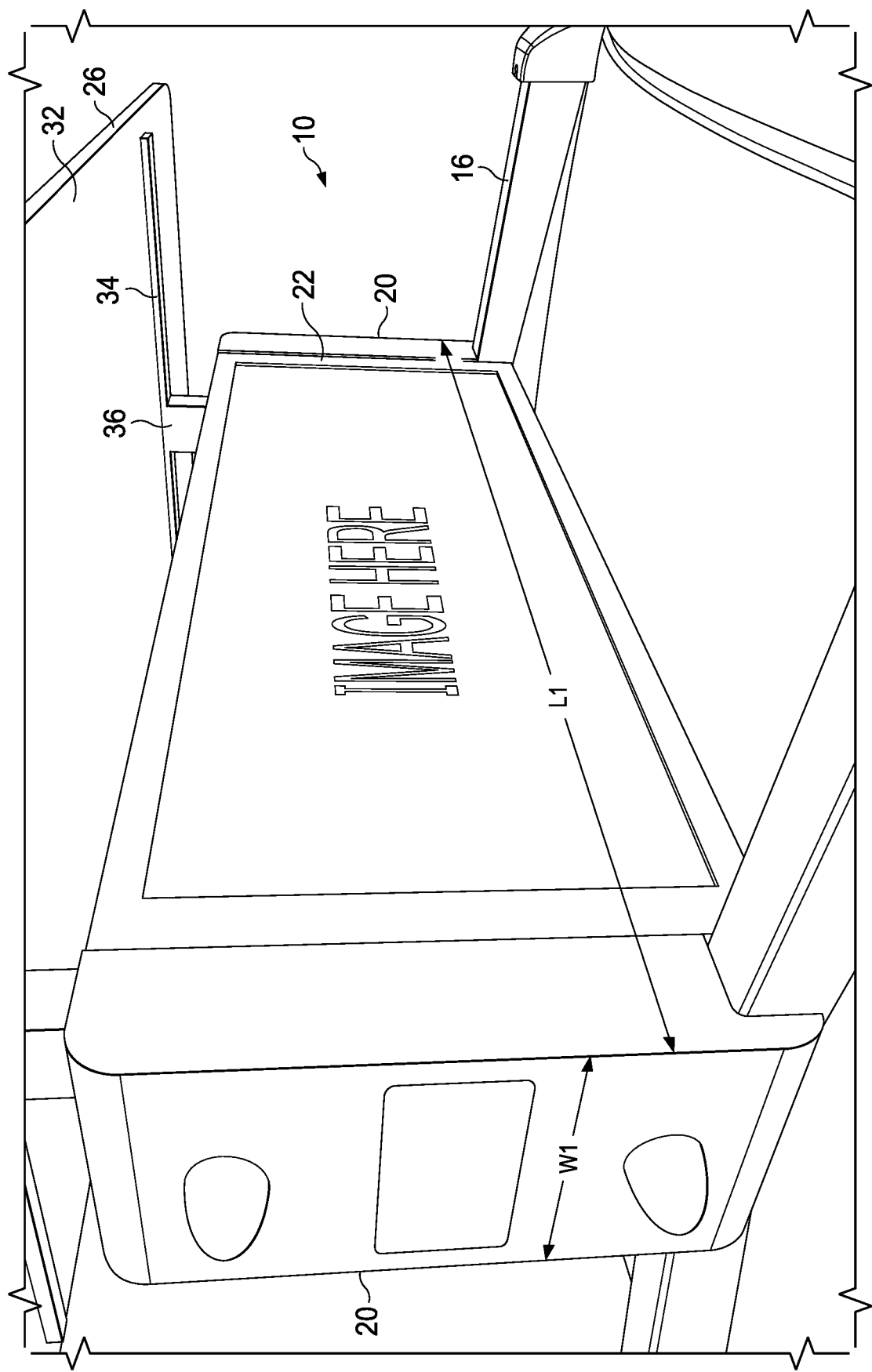
FIG. 3 is an enlarged, right side perspective view of the VMDU of FIG. 1.
Figure 4:
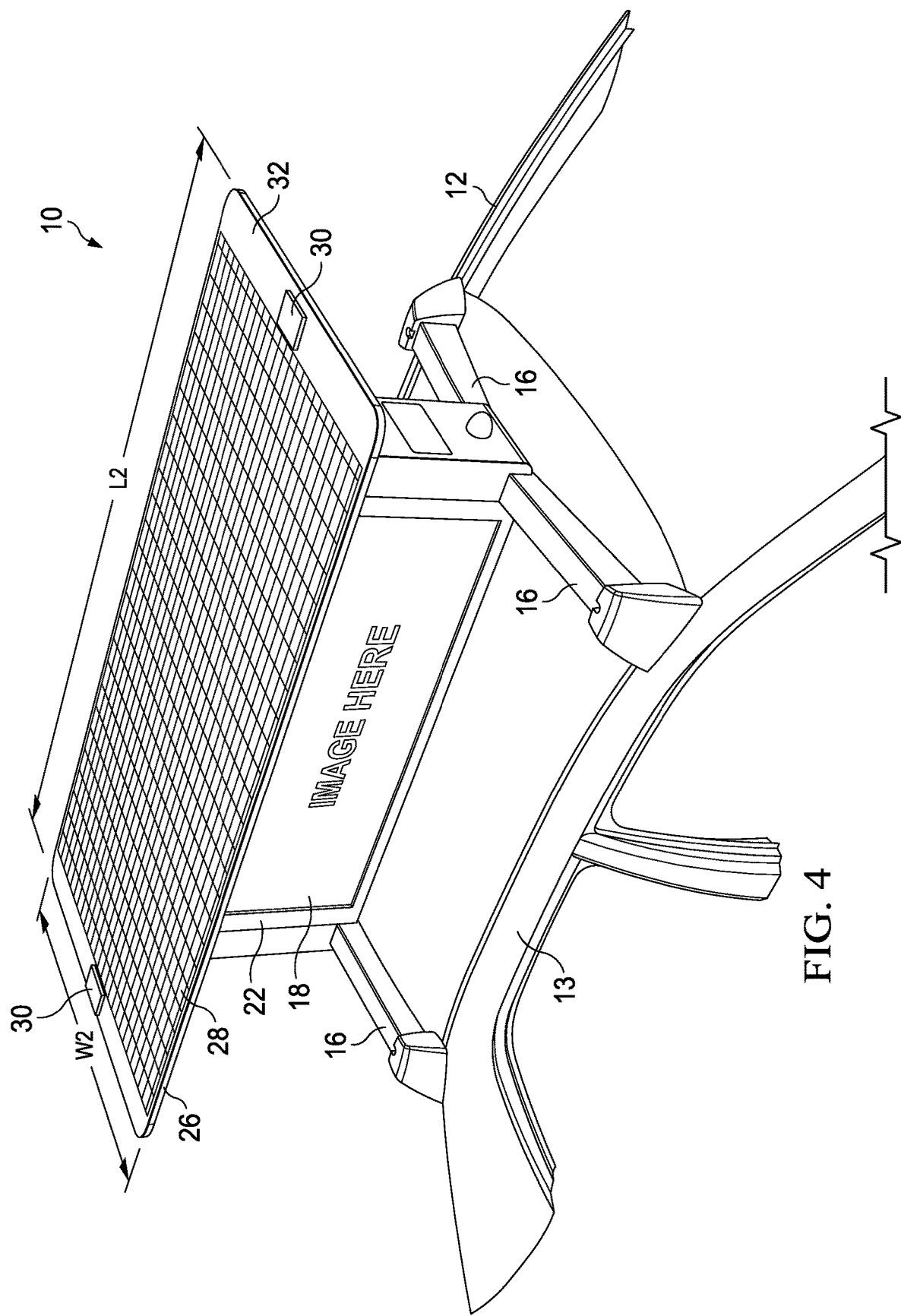
FIG. 4 is a top perspective view of the VMDU of FIG. 1.

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

FIG. 1 through FIG. 4 illustrate an exemplary VMDU 10. The VMDU 10 may be employed to display information to the public along public roadways, such as, for example, advertisements, public service announcements and the like. Further, the VMDU 10 may be fabricated in any size and shape, may be mounted to a vehicle 12 directly or indirectly, and may be mounted in any orientation (e.g., parallel to the longitudinal dimension of the vehicle 12, angled, and/or otherwise). Further, while the VMDUs 10 of FIGS. 1-7 are shown as being mounted to the roof 13 of a vehicle 12, the VMDUs 10 may be mounted to other portions of the vehicle 12 (e.g., hood and/or trunk) as well.

The vehicle 12 may be gasoline powered, hybrid powered (e.g., gasoline and electric), diesel powered, electric powered, fuel cell powered, hydrogen powered, human powered, some combination thereof, and/or the like. Further, the vehicle 12 may be any type of vehicle, including for example without limitation, a personal vehicle, a commercial vehicle, a rideshare vehicle, a taxi cab, a limousine, a town car, a bus, an SUV, a sedan, a delivery vehicle, a trailer, a van, a motorcycle, a scooter, a tricycle, or the like.

As shown, the VMDU 10 may be indirectly mounted to a vehicle 12 by way of a mounting system 14. The mounting system 14 may comprise one or more crossbars 16. The crossbars 16 may be configured for securement to a roof 13 of a vehicle 12. The crossbars 16 may be fabricated in any size, shape (e.g., cross-section), and type. The crossbars 16 may be configured to provide a sufficient degree of strength and rigidity to securely support the VMDU 10.

The mounting system 14 may further comprise one or more bolts, screws, brackets, fasteners, adapters, some combination thereof, or the like for mounting the VMDU 10 to the crossbars 16 (e.g., mounting the VMDU housing 20 to the crossbars 16) and/or the crossbars 16 to the vehicle 12. Alternatively, or additionally, adhesive, welding, bonding, some combination thereof, or other joining techniques may be utilized.

One or more supports 36, which may vary in terms of size and shape (e.g., substantially rectangular), may be provided. The supports 36 may extend vertically between the housing 20 and each of one or more solar energy harvesting devices 24 to elevate a bottom surface of the solar energy harvesting devices 24 from an upper surface of the VMDU 10. Doing so may facilitate access to the VMDU 10, which may be useful for maintenance and servicing efforts. In one example, the supports 36 may be mounted to the housing 20 at a first end. The supports 36 may be mounted to lifting eyes located on the housing 20. In other exemplary embodiments, the supports 36 may extend into or through some or all of the housing 20 and may be mounted to one or more internal structural components of the VMDU 10 and/or one or more components of the mounting system 14 (e.g., onto the crossbars 16). In exemplary embodiments, a first support 36 may be placed on a proximal portion of the VMDU 10, and a second support 36 may be placed on a distal portion of the VMDU 10. Other quantities and arrangements of supports 36 may also be utilized. The mounting of the supports 36, and/or other components described herein, may be performed by fasteners (such as, but not limited to, rivet nuts, bolts, screws, nails, some combination thereof, or the like), adhesives, welding, bonding, some combination thereof, or the like.

In some non-limiting examples, the VMDU 10 may comprise one or more side assemblies 22. Each side assembly 22 may comprise an electronic display 18. Each side assembly 22 may be configured to swing or otherwise rotate, pivot, or move outwardly to facilitate access to the components located inside the side assembly 22 and/or other portions of the VMDU 10, which may include signage, cooling pathways, lights, fans, electronic displays, mounting components, structural components, electrical circuitry, various electronics for operating the VMDU 10 and/or the solar energy harvesting device 24, some combination thereof, or the like. Each side assembly 22 may comprise an electronic display layer, a transparent cover panel, a backlight, some combination thereof, or the like. The backlight may comprise direct backlighting, edge lighting, some combination thereof, or the like. In other exemplary embodiments, a separate backlight may not be required as the electronic display 18 may be an emissive type display, such as, but not limited to, organic light emitting diode type displays. The electronic display 18 may be any type of electronic display such as, but not limited to, liquid crystal, organic light emitting diode, QLED, light emitting diode, cathode ray tube, plasma, some combination thereof, or the like.

In exemplary embodiments, at least 5 inches of clearance may be provided between an upper surface of the VMDU 10 and a lower surface of the solar energy harvesting device 24, though any distance, or varying distances, may be utilized. This clearance may be provided to facilitate the casting of shade on the electronic display 18, the VMDU 10, the interior of the vehicle 12, some combination thereof, or the like, thereby preventing the VMDU from experiencing excessive solar (e.g., thermal) loading and/or to provide certain desirable aerodynamic effects.

Stiffeners 34 may be provided. The stiffeners 34 may extend horizontally along a lower surface of the substrate 32. The stiffeners 34 may extend from either side of each of the one or more supports 36. The stiffeners 34 shown extend substantially across the entire width $W_2$ of the solar energy harvesting device 24, but this is not required. In exemplary embodiments, the stiffeners 34 may be sandwiched between an upper surface of each of the one or more supports 36 and a lower surface of the substrate 32. The stiffeners 34 may be provided under some or all of the solar energy harvesting device 24 and may provide structural stability, strength, and/or rigidity.

In exemplary embodiments, the solar energy harvesting device 24 may be substantially rectangular in shape, though other shapes are also contemplated. The solar energy harvesting device 24 may have a width $W_2$ that is greater than the width $W_1$ of the housing 20. Alternatively, or additionally, the solar energy harvesting device 24 may have a length $L_2$ that is greater than the length $L_1$ of the housing 20. The width dimensions $W_1$, $W_2$ and the length dimensions $L_1$, $L_2$ may be maximum width and length dimensions, respectively, for the solar energy harvesting device 24 and the housing 20, respectively. Stated another way, the solar energy harvesting device 24 may have a larger footprint than the footprint of the housing 20. This may provide for increased surface area for collecting solar energy. This may, additionally or alternatively, shade some or all of the housing 20, various components thereof (such as, but not limited to, the electronic display 18), and/or the vehicle 12 when placed in outdoor environments. Such shade may result in better image quality, including, but not limited to, improvised color saturation, contrast, some combination thereof, or the like. This may reduce the brightness levels needed to drive the electronic displays 18, thus resulting in reduced cooling needs. The shade may also decrease the solar loading experienced by the VMDU 10, thus reducing cooling needs.

Those skilled in the art will appreciate that any size, shape, number, type, and orientation of the solar energy harvesting device 24 may be utilized without departing from the scope of the present disclosure. While L1, L2, W1, and W2 may represent maximum dimensions, one or more of L1, L2, W1, and/or W2 may represent minimum dimensions. For example, without limitation, the minimum dimensions of the solar energy harvesting devices 24, W2 and/or L2, may be greater than the maximum dimensions of the housing 20, W1 and/or L1.

The solar energy harvesting device 24 may comprise one or more photovoltaic cells 28. The photovoltaic cells 28 may be mounted to one or more substrates 32. Normally, the photovoltaic cells 28 and/or the substrate 32 may comprise rough edges. A side edge 26 may be provided around an outer edge of the photovoltaic cells 28 and/or the substrate 32. The side edge 26 may provide a smoother surface which is safer for pedestrian interaction and is more aesthetically appealing.

One or more antenna 30 may be provided at the solar energy harvesting device 24. The antenna 30 may be configured to receive and/or transmit radio signals, cellular signals, GPS or other location tracking signals, Bluetooth® or other near field communication signals, some combination thereof, or the like. The antenna(s) 30 may be mounted to the substrate 32, wherein a first antenna 30 may be provided on a front portion of the substrate 32 and a second antenna 30 may be provided on a rear portion of the substrate 32. These antennae 30 may be centered with respect to the side edges of the substrate 32. While any number and position of antenna 30 may be utilized, the configuration of antenna(s) 30 shown may minimize obstructions, thereby improving the transmission and/or receipt of signals.

One or more cameras 44 may be provided at the solar energy harvesting device 24. The cameras 44 may be mounted to the substrate 32. In exemplary embodiments, a first and second camera 44 may be provided on the left and right sides of the substrate 32, respectively, and may be centered from the front to the back (though any number and positioning of the cameras 44 may be utilized). In other exemplary embodiments, the camera 44 may be positioned on a distal end of one or more of the stiffeners 34. Other quantities and positions of the camera(s) 44 may also be utilized without departing from the scope of the present disclosure. In one non-limiting embodiment, the camera(s) 44 may be in electronic communication with the antenna 30 (though such is not required) so that images and/or video may be transmitted to an interested party. In operation, this may be performed for one or more of a variety of different purposes, such as, but not limited to, determining which advertisements and/or public service announcements may be appropriate based on the demographics of the people nearby. Additionally, or alternatively, this data may even be used to turn off the electronic displays 18 remotely.

The solar energy harvesting device 24 may be in electrical connection with various components of the VMDU 10, such as, but not limited to, the electronic displays 18 one or more energy storage devices 38. Additionally, or alternatively, the solar energy harvesting device 24 may be in electrical connection with one or more energy sources 40. The energy storage device 38 may comprise one or more batteries. The energy sources 40 may comprise one or more batteries, alternators, some combination thereof, or the like. In exemplary embodiments, the energy storage device 38 and the energy source 40 may be one and the same, though such is not required.

A controller 42 may be interposed between one or more of: the solar energy harvesting device 24, the VMDU 10, the energy storage device 38, and the energy source 40. The controller 42 may be configured to determine when to draw power from the energy storage device 38 and/or the energy source 40, and when to supply excess energy from the solar energy harvesting device 24 to the energy storage device 38.

While certain components, such as, but not limited to, the energy storage device 38, the energy source 40, and the controller 42 are illustrated as being located outside of the VMDU 10 and the solar energy harvesting device 24, such components may be, partially or entirely, internal to the VMDU 10 and/or the solar energy harvesting device 24. In other words, such components may be placed at any location.

The VMDU 10 may comprise one or more sensors 11 such as, but not limited to, temperature sensors, fan speed sensors, ambient light sensors, accelerometers, some combination thereof, or the like. In this way, the amount of cooling, the brightness of the electronic displays 18, the speed of the fans, some combination thereof, or the like may be adjusted based on ambient temperature, vehicle 12 movement, ambient lighting conditions (including, but not limited to, the amount of shade cast), some combination thereof, or the like. Where wireless connectivity is utilized, data may be collected by these sensors 11 and may be transmitted to one or more remote parties and/or locations where this type of data is desired.

Figure 5:
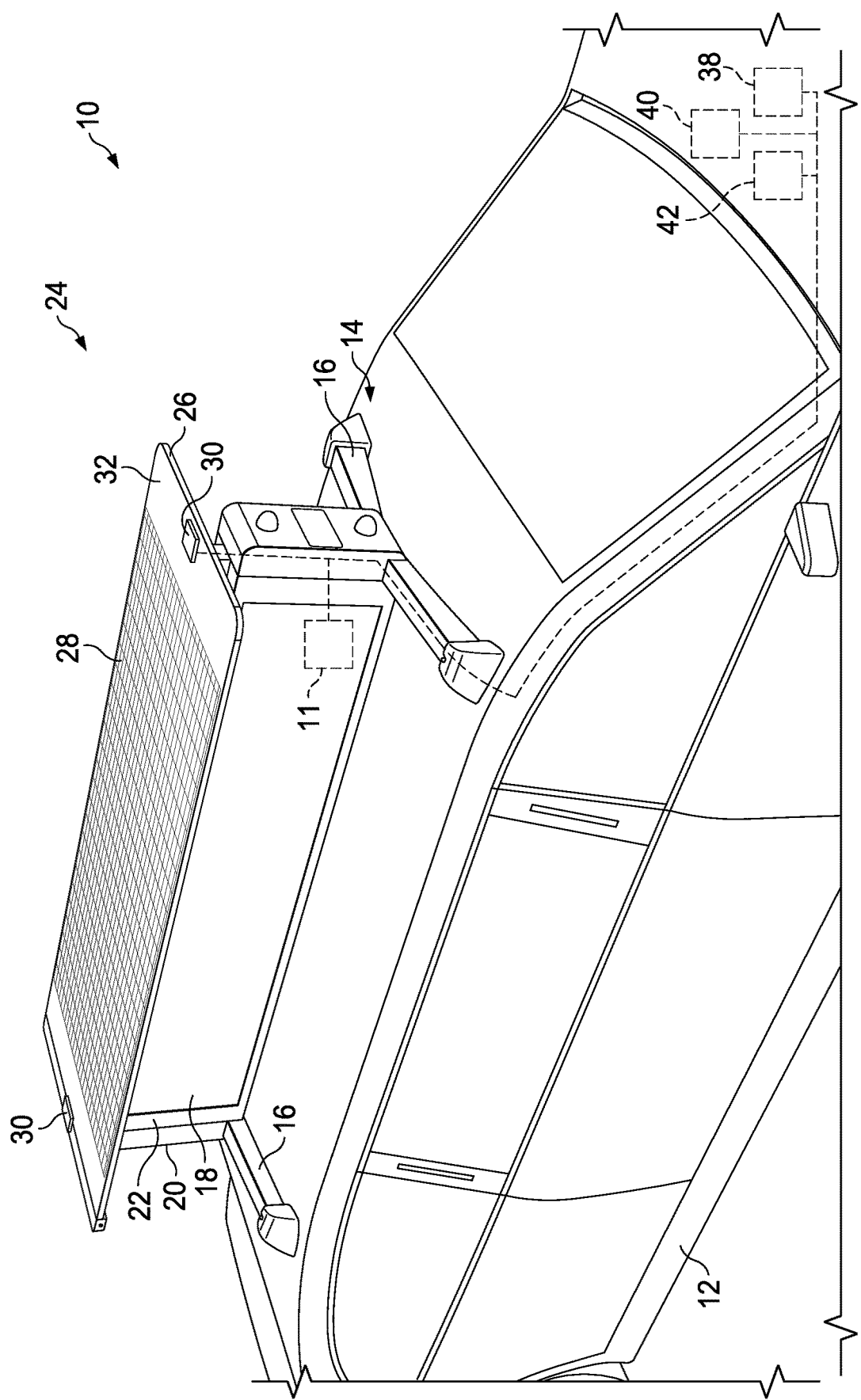
FIG. 5 is a front perspective view of another exemplary VMDU with another exemplary solar energy harvesting device with certain internal components revealed and illustrated in simplified form.
Figure 6:
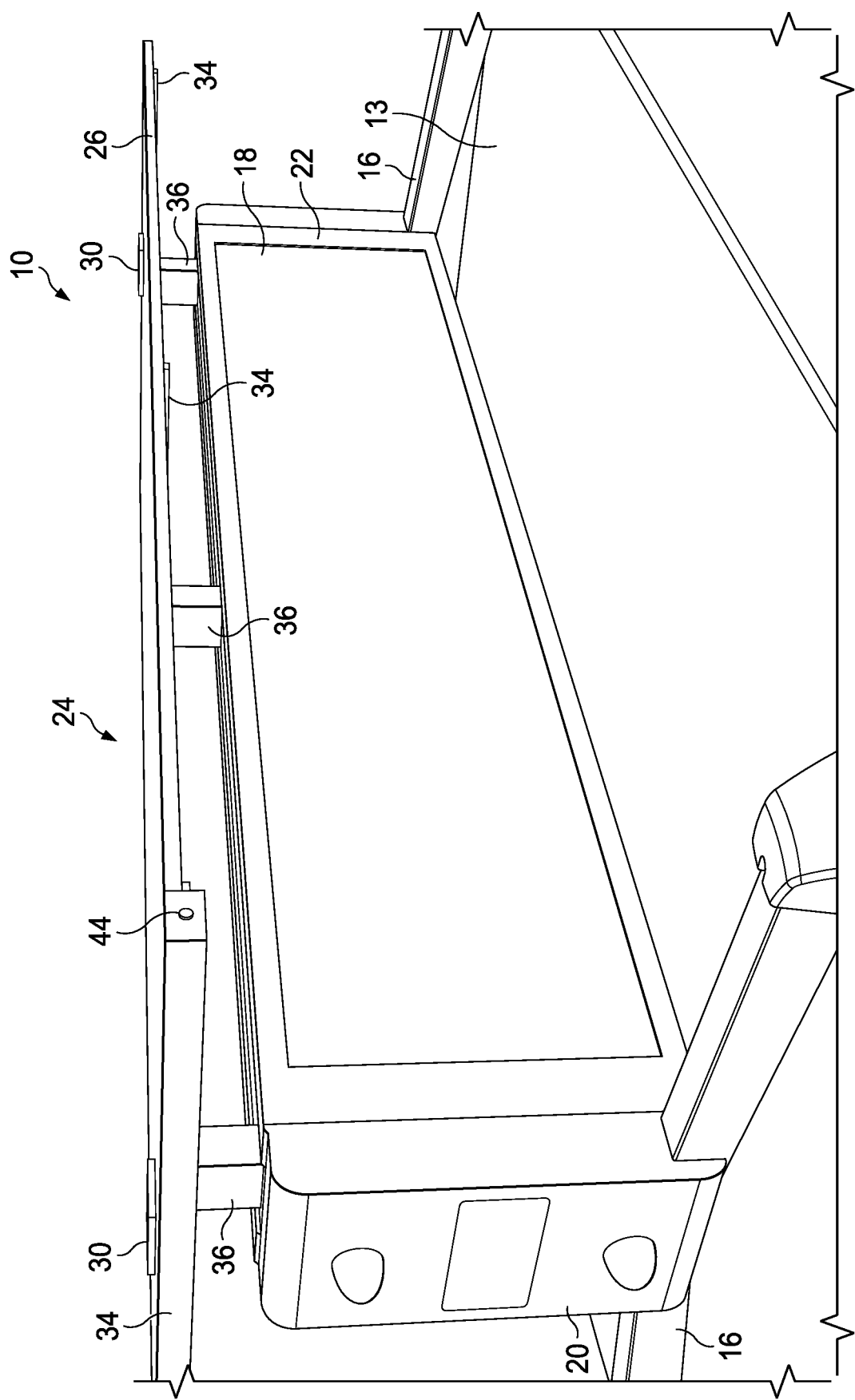
FIG. 6 is an enlarged, right side perspective view of the VMDU of FIG. 5.
Figure 7:
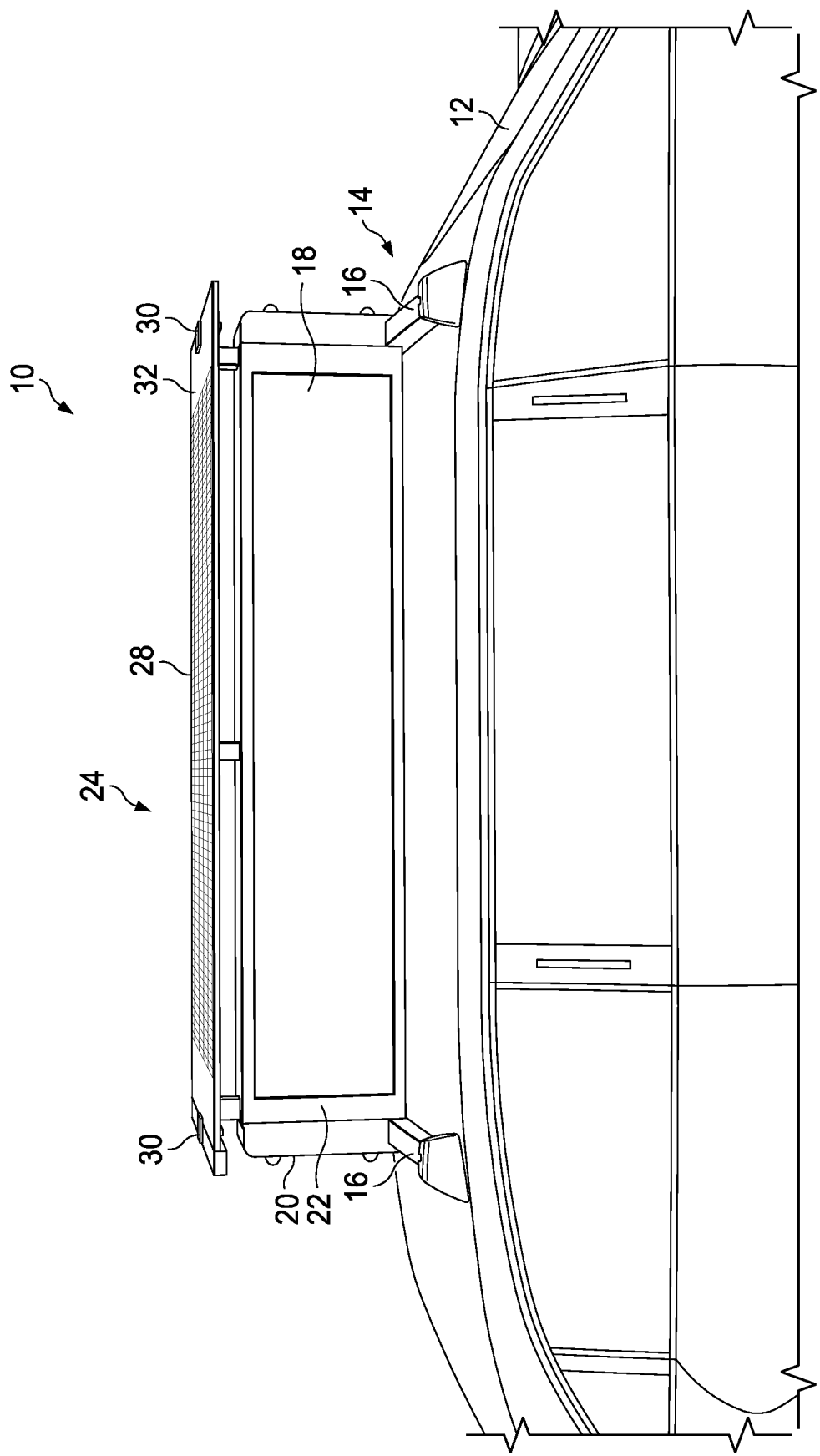
FIG. 7 is a left side view of the VMDU of FIG. 5.

FIG. 5 through FIG. 7 illustrate another exemplary VMDU 10. The VMDU 10 may have an elongated shape, which may be better suited for particularly long vehicles 12, such as, but not limited to, limousines, buses, RVs, trailers, and/or the like. In such embodiments, an elongated solar energy harvesting device 24 may be provided with multiple supports 36 to ensure that the solar energy harvesting device 24 (which may also be elongated) is adequately supported. In other exemplary embodiments, multiple solar energy harvesting devices 24 may be provided in a substantially linear fashion along the VMDU 10. Those skilled in the art will appreciate, however, that any size, number, and arrangement of electronic display 18 and/or solar energy harvesting devices 24 may be utilized for any size and type of vehicle 12 without departing from the scope of the present disclosure.

The VMDU 10 may be substantially rectangular in shape, though VMDUs 10 of other sizes and/or shapes may also be utilized. Similarly, the solar energy harvesting devices 24 may be provided in any size, shape, orientation (e.g., flush or mounted at an angle), number, type (e.g., opaque, transparent, or translucent panels), composition (e.g., comprising one or more photovoltaic cells) and/or the like. Further, some or all of the solar energy harvesting devices 24 may even be configured to swivel, pivot, tilt, rotate, some combination thereof, and/or the like. Such movement may be accomplished manually or automatically, such as by motor and controller configured to track the sun's movement.

Figure 8:
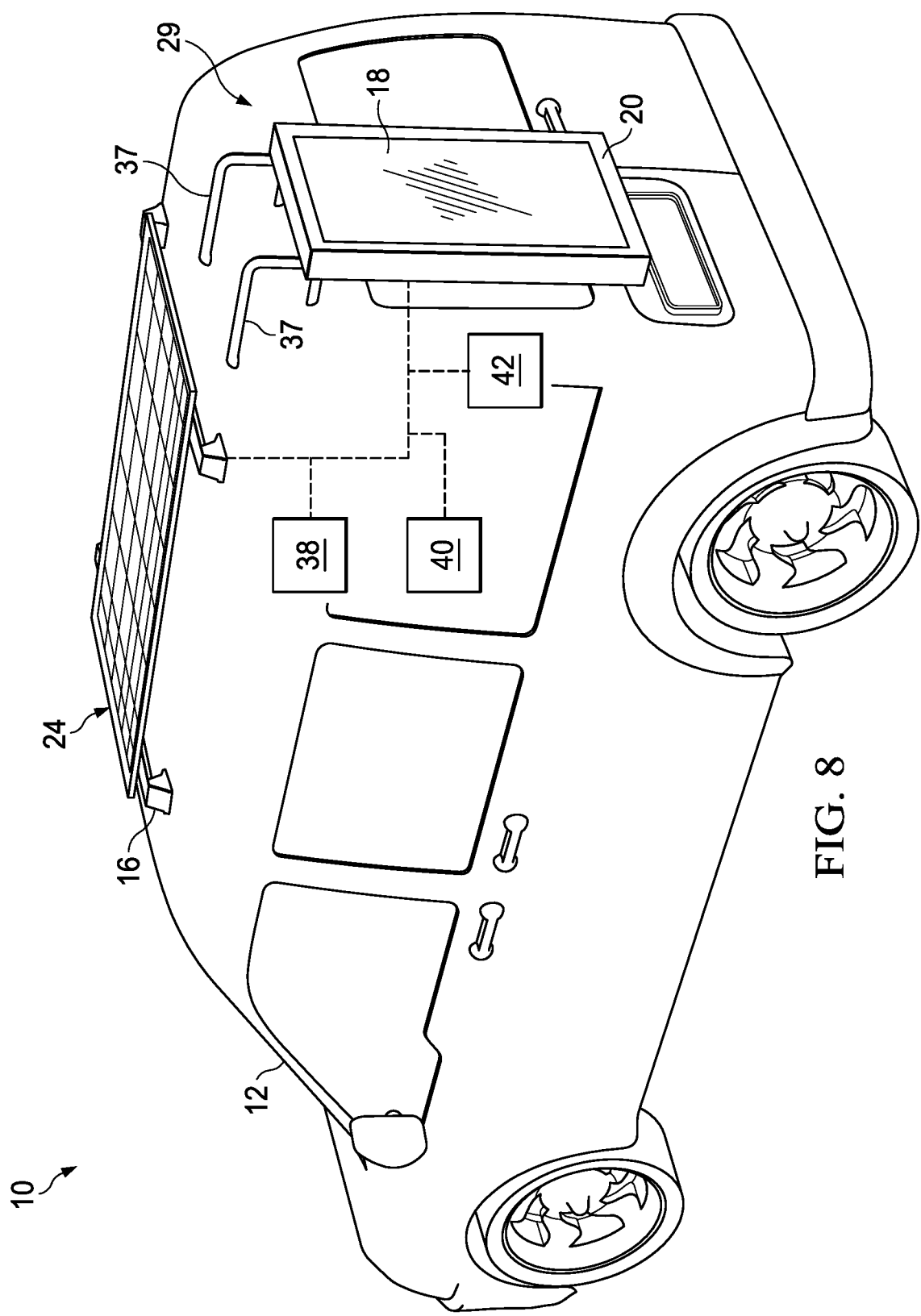
FIG. 8 is a perspective view of another exemplary VMDU with another exemplary solar energy harvesting device with certain internal components revealed and illustrated in simplified form.

FIG. 8 illustrates another exemplary VMDU 10. The VMDU 10 may comprise a display unit 29 which is separate from, but electrically connected to, the solar energy harvesting device(s) 24. The display unit 29 may comprise one or more electronic displays 18 located partially, or entirely, within a housing 20. The housing 20 may be mounted to the vehicle 12. One or more mounting supports 37 may extend from, or within, the housing 20 to a portion of the vehicle 12 and be secured thereto. For example, without limitation, the display unit 29 may be mounted to a rear portion, side portion, front portion, roof, some combination thereof, or the like, of the vehicle 12. Placement of the display unit 29 may be selected to improve visibility, provide multiple displays, and/or improve aerodynamics. More than one display unit 29 may be provided, each of which may be mounted to the same of different portions of the vehicle 12.

In exemplary embodiments, the solar energy harvesting devices 24 may measure approximately 1×2 m, though any size, shape, and number of solar energy harvesting devices 24 may be utilized. The solar energy harvesting devices 24 may be mounted to another location of the vehicle 12. In exemplary embodiments, the solar energy harvesting devices 24 are mounted to a roof portion of the vehicle 12, such as, but not limited to, by way of the crossbars 16, however other locations and types of mounting devices may be utilized. For example, without limitation, solar energy harvesting devices 24 may be mounted to a rear portion, side portion, front portion, roof, some combination thereof, or the like, of the vehicle 12. Placement of the solar energy harvesting devices 24 may be selected to improve sunlight exposure, provide multiple solar panels, and/or improve aerodynamics. More than one solar energy harvesting devices 24 may be provided, each of which may be mounted to the same of different portions of the vehicle 12.

An electrical connection, such as by way of wiring, may be provided between the solar energy harvesting devices 24 and one or more components of the display unit 29, such as, but not limited to, the electronic displays 18. Such connections may extend partially or completely within the crossbars 16, other mounting devices, and/or the mounting supports 37. One or more energy storage devices 38, energy sources 40, and/or controllers 42 may be electrically interposed between the solar energy harvesting devices 24 and the display unit 29. In exemplary embodiments, one or more of the energy storage devices 38, energy sources 40, and/or controllers 42 may be provided at the solar energy harvesting devices 24 and/or the display unit 29.

Any number or type of mounting devices, such as, but not limited to, crossbars 16, mounting supports 37, supports 36, members, adhesive, fasteners, welding, ties, some combination thereof, and the like may be utilized to secure the VMDU 10, including but not limited to, each of the display units 29 and each of the solar energy harvesting devices 24 to various portions of the vehicle 12.

Figure 9:
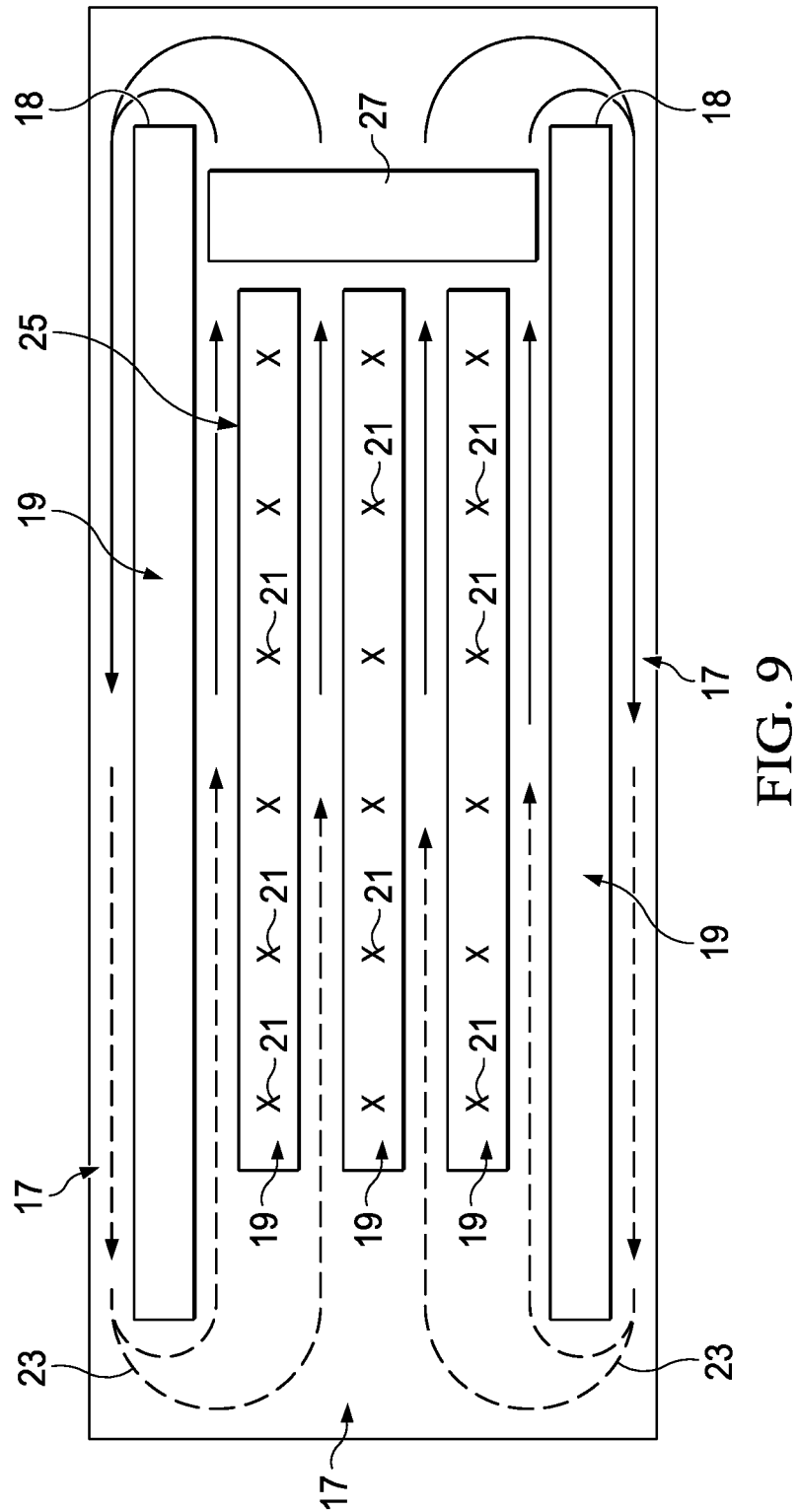
FIG. 9 is a top sectional view of the VMDUs of FIGS. 1-8.

FIG. 9 illustrates a top sectional view of the VMDU 10, such as, but not limited to, the display unit 29. The VMDU 10 comprise one or more cooling pathways. Such cooling pathways may comprise openings configured to ingest and exhaust ambient air 21 into and out of one or more open loop pathways 19. In exemplary embodiments, the open loop pathways 19 may pass along backlights for the electronic displays 18. Such cooling pathways may include, additionally or alternatively, closed loop pathways 17 located entirely within the VMDU 10 for circulating gas 23. In exemplary embodiments, the closed loop pathways 17 may encircle the electronic display(s) 18 by passing through a gap between the transparent cover panel and the electronic display 18 of a given side assembly 22. Further, various components may be positioned within either one of the closed loop and the open loop pathways 17, 19. For example, one or more electronic components for operating the VMDU 10 may be provided within or along the closed loop pathways 17. One or more fans may be provided within or along the open loop pathways 19 to force ambient air therethrough. One or more fans 27 may be provided within or along the closed loop pathways 17 to force circulating gas therethrough. A heat exchanger 25 may be provided, preferably behind the electronic display(s) 18, to permit heat transfer between the relatively warm circulating gas 23 in the closed loop pathways 17 and the relatively cool ambient air 21 in the open loop pathways 19.

Figure 10:
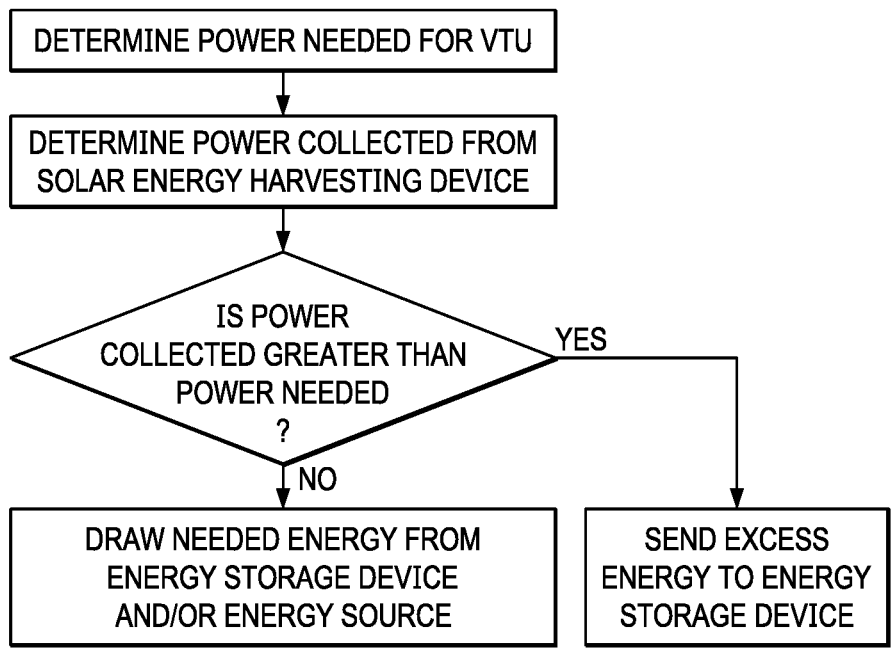
FIG. 10 is a flowchart with exemplary logic for operating the VMDU of FIGS. 1-9.

FIG. 10 provides a flowchart with exemplary logic for operating the VMDU 10 and related components. The controller 42 may determine the amount of power needed to operate the VMDU 10. This determination may be made, at least in part, based on readings from the sensors 11, operational data from the VMDU 10, historical information, predictions, some combination thereof, or the like. During sufficiently sunny conditions, the controller 42 may be configured to direct power collected from the solar energy harvesting device 24 to the VMDU 10. If excess energy is collected, the controller 42 may be configured to direct such excess power to the one or more energy storage devices 38. If insufficient energy is provided from the solar energy harvesting device 24, such as during nighttime or cloudy conditions, the controller 42 may be configured to direct energy from the one or more energy storage devices 38 and/or the energy sources 40 to VMDU 10. In this way, the VMDU 10 may be periodically, or continuously, powered by the solar energy harvesting device 24. For certain vehicles 12, this may result in improved gas mileage, though such is not required.

The controller 42 may be configured to monitor electrical draw from the VMDU 10. The controller 42 may, alternatively or additionally, be configured to monitor electrical production from the solar energy harvesting device 24. Electrical draw and production may be monitored in the form of one or more of the following: current, wattage, voltage, some combination thereof, or the like. The controller 42 may, alternatively or additionally, be configured to monitor one or more of the following: ambient lighting conditions (by way of one or more ambient light sensors 11), forecasted weather conditions (by way of network accessible weather data accessed by way of a network connectivity device 15), current or forecasted electrical billing rates (by way of network accessible rate data accessed by way of a network connectivity device 15), user preferences (received by way of the network connectivity device 15), some combination thereof, or the like. In utilizing such information, the controller 42 may be configured to determine which energy source(s) 40 to draw from.

In exemplary embodiments, the electrical systems may be entirely direct current ("DC"). For example, without limitation, the VMDU 10, the solar energy harvesting devices 24, the energy storage devices 38, the energy sources 40, the controller 42, some combination thereof, or the like may be configured to operate solely using DC power. The components and power utilized herein may, in exemplary embodiments without limitation, exclusively utilize direct current power such that no AC-DC or DC-AC inverters or the like are required.

Figure 11:
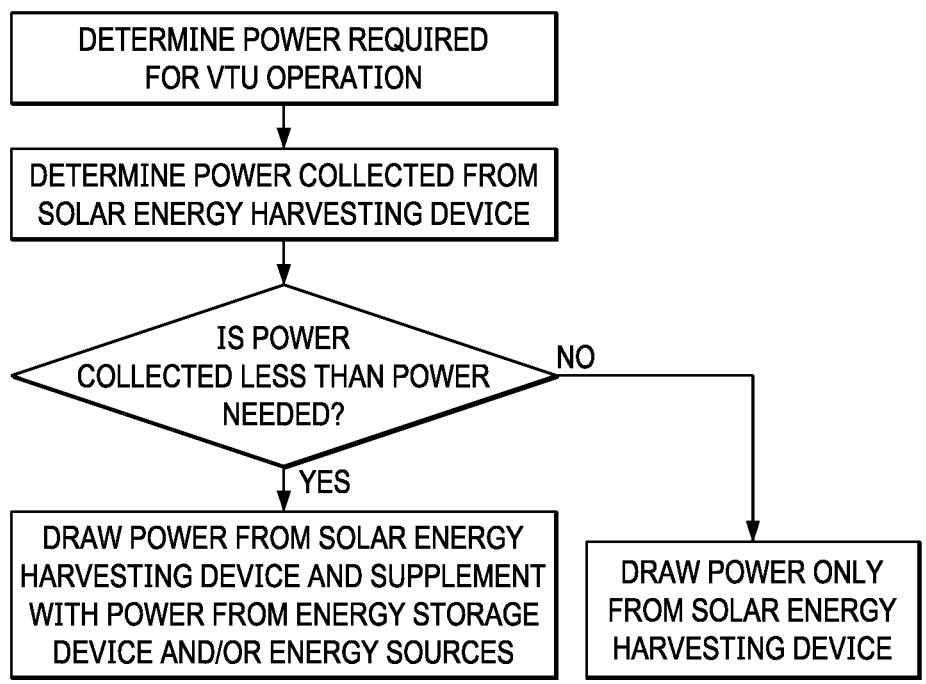
FIG. 11 is a flowchart with other exemplary logic for operating the VMDU of FIGS. 1-9.

FIG. 11 provides a flowchart with exemplary logic for operating the VMDU 10 and related components. The controller 42 may determine the amount of power required to operate the VMDU 10. This determination may be made, at least in part, based on readings from the sensors 11, operational data from the VMDU 10, historical information, predictions, some combination thereof, or the like. During sufficiently sunny conditions, the controller 42 may be configured to direct power collected from the solar energy harvesting device 24 to the VMDU 10. Where sufficient energy is collected, the controller 42 may be configured to power the VMDU 10 only with energy generated by the one or more solar energy harvesting devices 24. Where the power generated by the one or more solar energy harvesting devices 24 is insufficient to power the VMDU 10, the controller 42 may be configured to supplement the power supplied by the one or more solar energy harvesting devices 24 with power from the one or more energy storage devices 38. In this way, power may be drawn from the energy storage devices 38 and/or energy sources 40. Power may be drawn from the energy storage devices 38 and/or energy sources 40 only when needed, and only as much as needed to supplement the power generated by the one or more solar energy harvesting devices 24 to meet the power requirements of the VMDU 10. In this way, the burden on the energy storage devices 38 and/or energy sources 40 may be reduced or eliminated. Furthermore, the VMDU 10 may be periodically, continuously, partially, or wholly powered by the solar energy harvesting device 24. For certain vehicles 12, this may result in improved gas mileage, among other benefits, though such is not required. This may also reduce environmental impact of the VMDU 10.

The controller 42 may be configured to monitor electrical draw and/or needs for the VMDU 10. The controller 42 may, alternatively or additionally, be configured to monitor electrical production from the solar energy harvesting device 24. Electrical draw, needs, and/or production may be monitored by measuring one or more of the following: current, wattage, voltage, some combination thereof, or the like. The controller 42 may, alternatively or additionally, be configured to monitor one or more of the following: ambient lighting conditions (by way of one or more ambient light sensors 11), forecasted weather conditions (by way of network accessible weather data accessed by way of a network connectivity device 15), current or forecasted electrical billing rates (by way of network accessible rate data accessed by way of a network connectivity device 15), user preferences (received by way of the network connectivity device 15), some combination thereof, or the like. The controller 42 may be configured to utilize such information to determine which energy source(s) 40 to utilize.

Operations of the VMDU 10 may be adjusted to raise or lower power requirements of the VMDU 10. For example, without limitation, where the power required for VMDU 10 operations is less than the power generated by the solar energy harvesting device 24, certain operations may be adjusted such as, but not limited to, increasing backlight levels to improve image quality. As another example, without limitation, where the power required for VMDU 10 operations is greater than the power generated by the solar energy harvesting device 24 by a predetermined amount, certain operations may be adjusted, such as, but not limited to, by decreasing backlight levels such that the solar energy harvesting device 24 may fully or more completely power the VMDU 10.

In exemplary embodiments, the electrical systems may be entirely direct current ("DC"). For example, without limitation, the VMDU 10, the solar energy harvesting devices 24, the energy storage devices 38, the energy sources 40, the controller 42, some combination thereof, or the like may be configured to operate using DC power. The components and power utilized herein may, in exemplary embodiments without limitation, exclusively utilize direct current power such that no AC-DC or DC-AC inverters or the like are required.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

Certain operations described herein may be performed by one or more electronic devices. Each electronic device may comprise one or more processors, electronic storage devices, executable software instructions, and the like configured to perform the operations described herein. The electronic devices may be general purpose computers or specialized computing devices. The electronic devices may be personal computers, smartphones, tablets, databases, servers, or the like. The electronic connections described herein may be accomplished by wired or wireless means.

What is claimed is:

1. A system for providing solar-generated power to a display unit mounted to a vehicle, said system comprising:
   an electronic display;

a housing for said electronic display;
one or more mounting supports for connecting said housing to said vehicle; and
a solar energy harvesting device configured for connection to an upper portion of the vehicle and electrical connection to said electronic display.

2. The system of claim 1 wherein:
said one or more mounting supports are configured to secure said electronic display to a rear portion of said vehicle.

3. The system of claim 1 wherein:
said one or more mounting supports are configured to secure said electronic display along a rear portion of said vehicle.

4. The system of claim 3 wherein:
said one or more mounting supports are configured to suspend said housing away from the rear portion of said vehicle.

5. The system of claim 1 wherein:
said one or more mounting supports are configured to secure said electronic display along a side portion of said vehicle.

6. The system of claim 1 wherein:
said one or more mounting supports are configured to secure said electronic display to a side portion of said vehicle.

7. The system of claim 1 further comprising:
one or more cross bars for securing said solar energy harvesting device to said upper portion of said vehicle, wherein said one or more mounting supports are configured to elevate said solar energy harvesting device above said housing.

8. The system of claim 7 wherein:
said solar energy harvesting device has a first footprint which is larger than a second footprint of said housing.

9. The system of claim 1 further comprising:
an energy storage device electrically interposed between said electronic display and said solar energy harvesting device; and
a controller electrically interposed between said energy storage device, said electronic display, and said solar energy harvesting device.

10. The system of claim 9 wherein:
said energy storage device comprises a vehicle battery; and
said vehicle comprises an electric propulsion system or an internal combustion engine.

11. The system of claim 9 wherein:
said solar energy harvesting device is configured to provide direct current ("DC") power; and
said electronic display is configured to operate using DC power.

12. The system of claim 1 further comprising:
an open loop pathway for ambient air within said housing.

13. The system of claim 12 wherein:
said electronic display comprises a layer of liquid crystals and a backlight; and
said open loop pathway extends along at least a portion of said backlight.

14. The system of claim 12 further comprising:
a closed loop pathway for circulating gas extending within said housing.

15. The system of claim 14 further comprising:
a heat exchanger, wherein said open loop pathway comprises a first portion of said heat exchanger, and wherein said closed loop pathway comprises a second portion of said heat exchanger; and
a fan placed within said closed loop pathway, wherein said fan is electrically connected to said solar energy harvesting device.

16. The system of claim 1 further comprising:
a second electronic display located within the housing such that said electronic display and said second electronic display face in different directions.

17. A system for providing solar-generated power to a display unit mounted to a vehicle, said system comprising:
an electronic display configured to display images;
a housing for said electronic display;
one or more mounting supports for connecting said housing to said vehicle such that said electronic display extends along a rear portion of said vehicle and faces rearward for viewing by occupants of other vehicles located behind the vehicle; and
a solar energy harvesting device for mounting to a roof of the vehicle and configured for electrical connection to said electronic display to provide said solar-generated power to said electronic display.

18. The system of claim 17 further comprising:
a controller electrically interposed between said solar energy harvesting device, an alternative power source, and said electronic display, wherein said controller is configured to regulate an amount of power supplied to said electronic display by said solar energy harvesting device and said alternative power source.

19. A system for providing solar-generated power to a display unit mounted to a vehicle, said system comprising:
said display unit comprising:
an electronic display for displaying images;
a housing for said electronic display, wherein said electronic display comprises a backlight and a layer of liquid crystals;
one or more fans located within said housing for cooling at least said backlight of said electronic display when operated;
one or more mounting supports connecting said display unit to said vehicle such that said display unit extends along a portion of said vehicle and said electronic display faces outward so that said images displayed at said electronic display are viewable exterior to the vehicle; and
a solar energy harvesting device mounted to the vehicle and electrically connected to at least said electronic display and said one or more fans of said display unit for providing said solar-generated power to at least said electronic display and said one or more fans on at least an occasional basis.

20. The system of claim 19 further comprising:
an alternative power source; and
a controller electrically interposed between said solar energy harvesting device, said alternative power source, and at least said electronic display and said one or more fans for regulating an amount and time for which said solar-generated power is supplied from said solar energy harvesting device to at least said electronic display and said one or more fans and an amount and time for which power is supplied by said alternative power source.

* * * * *